US010693443B1

(12) United States Patent
Golara

(10) Patent No.: US 10,693,443 B1
(45) Date of Patent: Jun. 23, 2020

(54) RELAXATION OSCILLATOR WITH IMPROVED TEMPERATURE STABILITY

(71) Applicant: QUALCOMM Incorporated, San Diego, CA (US)

(72) Inventor: Soheil Golara, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/589,309

(22) Filed: Oct. 1, 2019

(51) Int. Cl.
*H03K 3/011* (2006.01)
*H03K 3/0231* (2006.01)

(52) U.S. Cl.
CPC .......... *H03K 3/011* (2013.01); *H03K 3/0231* (2013.01)

(58) Field of Classification Search
CPC ........ H03K 3/0231; H03K 4/50; H03K 4/501; H03K 4/502; H03K 3/011
See application file for complete search history.

(56) References Cited

U.S. PATENT DOCUMENTS

| 9,356,554 B2* | 5/2016 | Tam | H03K 4/502 |
| 9,584,132 B2* | 2/2017 | Kim | H03L 1/02 |
| 9,602,052 B2* | 3/2017 | Satoh | G06F 1/04 |
| 2019/0149140 A1* | 5/2019 | Han | H03K 3/011 331/8 |

OTHER PUBLICATIONS

Paidimarri A., et al., "A 120nW 18.5kHz RC Oscillator with Comparator Offset Cancellation for ±0.25% Temperature Stability", IEEE International Solid-State Circuits Conference, ISSCC 2013 / Session 10 / Analog Techniques / 10.7, Feb. 19, 2013, 3 pages.
Tokairin T., et al., "A 280nW, 100kHz, 1-Cycle Start-up Time, On-chip CMOS Relaxation Oscillator Employing a Feedforward Period Control Scheme", IEEE 2012 Symposium on VLSI Circuits Digest of Technical Papers, pp. 16-17.

* cited by examiner

*Primary Examiner* — Ryan Johnson
(74) *Attorney, Agent, or Firm* — Patterson & Sheridan, L.L.P

(57) ABSTRACT

Certain aspects of the present disclosure generally relate to a low-power relaxation oscillator. Certain aspects provide a circuit for generating an oscillating signal. The circuit generally includes a comparator, a first current source coupled to a reference potential node, a first resistive element coupled between the first current source and a voltage rail, a node between the first current source and the first resistive element being selectively coupled to a first input terminal of the comparator, a second current source coupled between a second input terminal of the comparator and the voltage rail, and a first capacitive element selectively coupled between the second input terminal of the comparator and the reference potential node.

20 Claims, 5 Drawing Sheets

RELAXATION OSCILLATOR WITH IMPROVED TEMPERATURE STABILITY

TECHNICAL FIELD

Certain aspects of the present disclosure generally relate to electronic circuits and, more particularly, to an oscillator circuit.

BACKGROUND

Internet of Things (IoT) generally refers to the interconnection of uniquely-identifiable embedded devices within the Internet infrastructure. IoT is expected to result in new, wide-ranging types of applications in which virtually any type of physical thing may provide information about itself or its surroundings and/or may be controlled remotely via client devices over the Internet. For example, IoT devices may include sensors that can communicate over the Internet, and can be remotely monitored and controlled.

SUMMARY

Certain aspects of the present disclosure generally relate to a low-power relaxation oscillator.

Certain aspects provide a circuit for generating an oscillating signal. The circuit generally includes a comparator, a first current source coupled to a reference potential node, a first resistive element coupled between the first current source and a voltage rail, a node between the first current source and the first resistive element being selectively coupled to a first input terminal of the comparator, a second current source coupled between a second input terminal of the comparator and the voltage rai, and a first capacitive element selectively coupled between the second input terminal of the comparator and the reference potential node.

Certain aspects provide a method for generating an oscillating signal. The method generally includes sinking a first current through a first resistive element coupled between a first node and a voltage rail during a first phase, sourcing a second current to a first capacitive element coupled between a second node and a reference potential node during the first phase, sourcing a third current to a second resistive element coupled between the second input terminal and the reference potential node during a second phase, sourcing a fourth current to a second capacitive element coupled between the first node and the reference potential node during the second phase, and comparing voltages at the first node and the second node to generate the oscillating the oscillating signal.

Certain aspects provide an apparatus for generating an oscillating signal. The apparatus generally includes means for sinking a first current through a first resistive element coupled between a first node and a voltage rail during a first phase, means for sourcing a second current to a first capacitive element coupled between a second node and a reference potential node during the first phase, means for sourcing a third current to a second resistive element coupled between the second input terminal and the reference potential node during a second phase, means for sourcing a fourth current to a second capacitive element coupled between the first node and the reference potential node during the second phase, and means for comparing voltages at the first node and the second node to generate the oscillating the oscillating signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a low-power resistor-capacitor (RC) relaxation oscillator implemented with improved temperature stability as compared to conventional implementations. The low-power RC relaxation oscillator may be implemented to provide an oscillating signal having a constant period in response to temperature variations, allowing a device (e.g., device 100) to track time using relative low power as compared to other timing components, such as crystal oscillators.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Device

Figure 1:
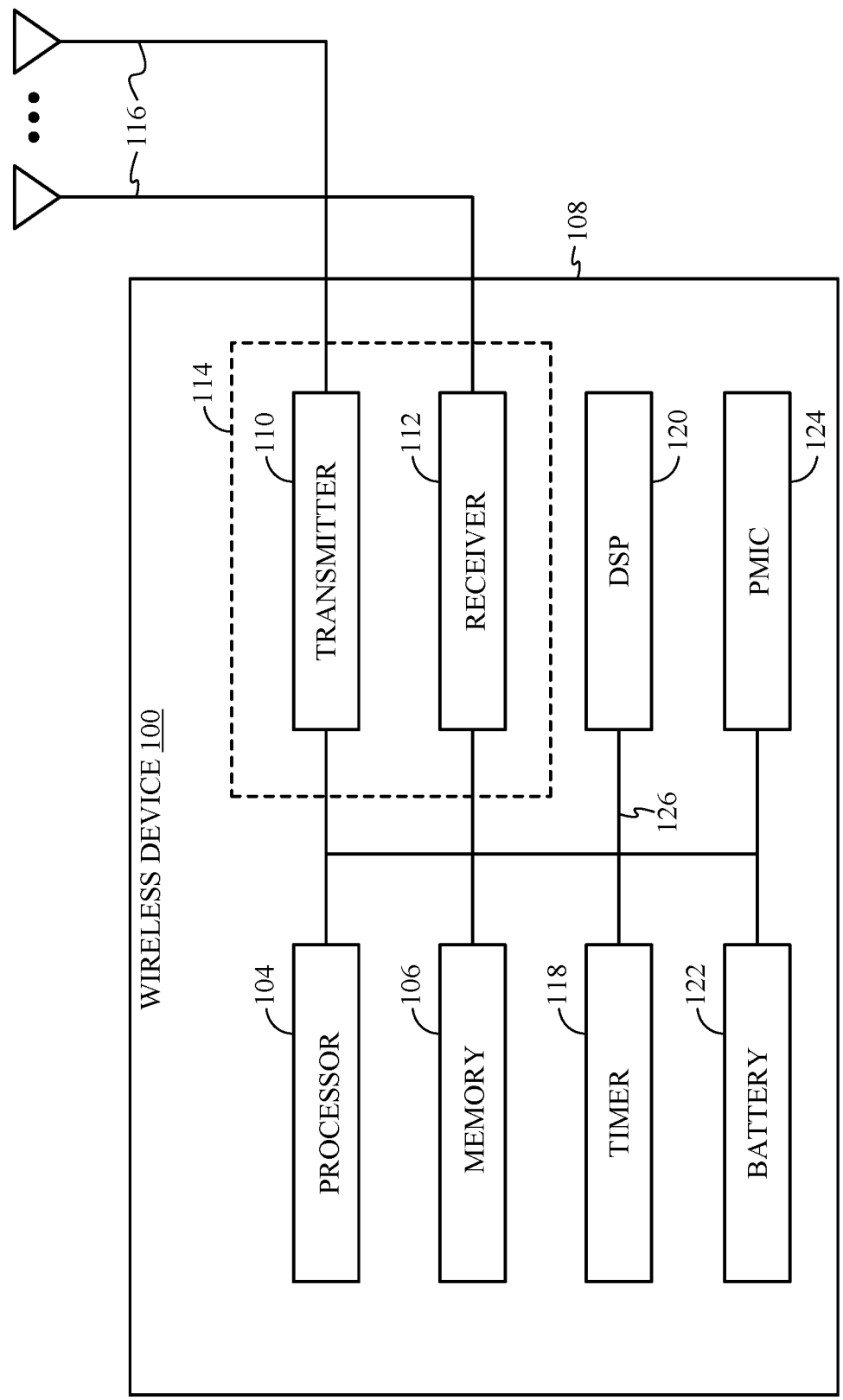
FIG. 1 illustrates a block diagram of an example device including a timer, according to certain aspects of the present disclosure.

FIG. 1 illustrates a device 100. The device 100 may be a battery-operated device such as a cellular phone, a personal digital assistant (PDA), a handheld device, a wireless modem, a laptop computer, a tablet, a personal computer, etc. The device 100 is an example of a device that may be configured to implement the various systems and methods described herein.

The device 100 may include a processor 104 and/or digital signal processor (DSP) 120 that controls operation of the device 100. The processor 104 and/or DSP 120 may also be referred to as a central processing unit (CPU). Memory 106, which may include both read-only memory (ROM) and random access memory (RAM), provides instructions and data to the processor 104. The processor 104 typically performs logical and arithmetic operations based on program instructions stored within the memory 106.

The device 100 may also include a housing 108 that may include a transmitter 110 and a receiver 112 to allow transmission and reception of data between the device 100 and a remote location. The transmitter 110 and receiver 112 may be combined into a transceiver 114. A plurality of transmit antennas 116 may be attached to the housing 108 and electrically coupled to the transceiver 114. The device 100 may also include (not shown) multiple transmitters, multiple receivers, and multiple transceivers.

The device 100 may also include a timer 118, which may be implemented with a low-power resistor-capacitor (RC) relaxation oscillator, as described in more detail herein. The low-power RC relaxation oscillator may be implemented to provide an oscillating signal having a constant period in response to temperature variations, allowing the device 100 to track time using relatively low power as compared to other timing components, such as crystal oscillators. The device 100 may further include a battery 122 used to power the various components of the device 100. The device 100 may also include a power management integrated circuit (power management IC or PMIC) 124 for managing the power from the battery to the various components of the device 100. The various components of the device 100 may be coupled together by a bus system 126, which may include a power bus, a control signal bus, and a status signal bus in addition to a data bus.

Example Relaxation Oscillator with Improved Temperature Stability

Internet of things (IoT) devices may spend a relatively long amount of time in sleep mode or some other low-power mode of operation. During the sleep mode of operation, many electrical components of the IoT device may be turned off to save power. However, IoT devices may still need to be able to track time during the sleep mode of operation. Thus, timing circuitry (e.g., timer 118) of the IoT device (e.g., device 100) may remain operational during the sleep mode of operation. Accordingly, it is important for the timing circuitry to be implemented to consume little power as compared to conventional implementations (e.g., circuitry implemented using crystal oscillators). Certain aspects of the present disclosure are generally directed to a low-power resistor-capacitor (RC) relaxation oscillator implemented with improved temperature stability as compared to conventional implementations.

Figure 2A:
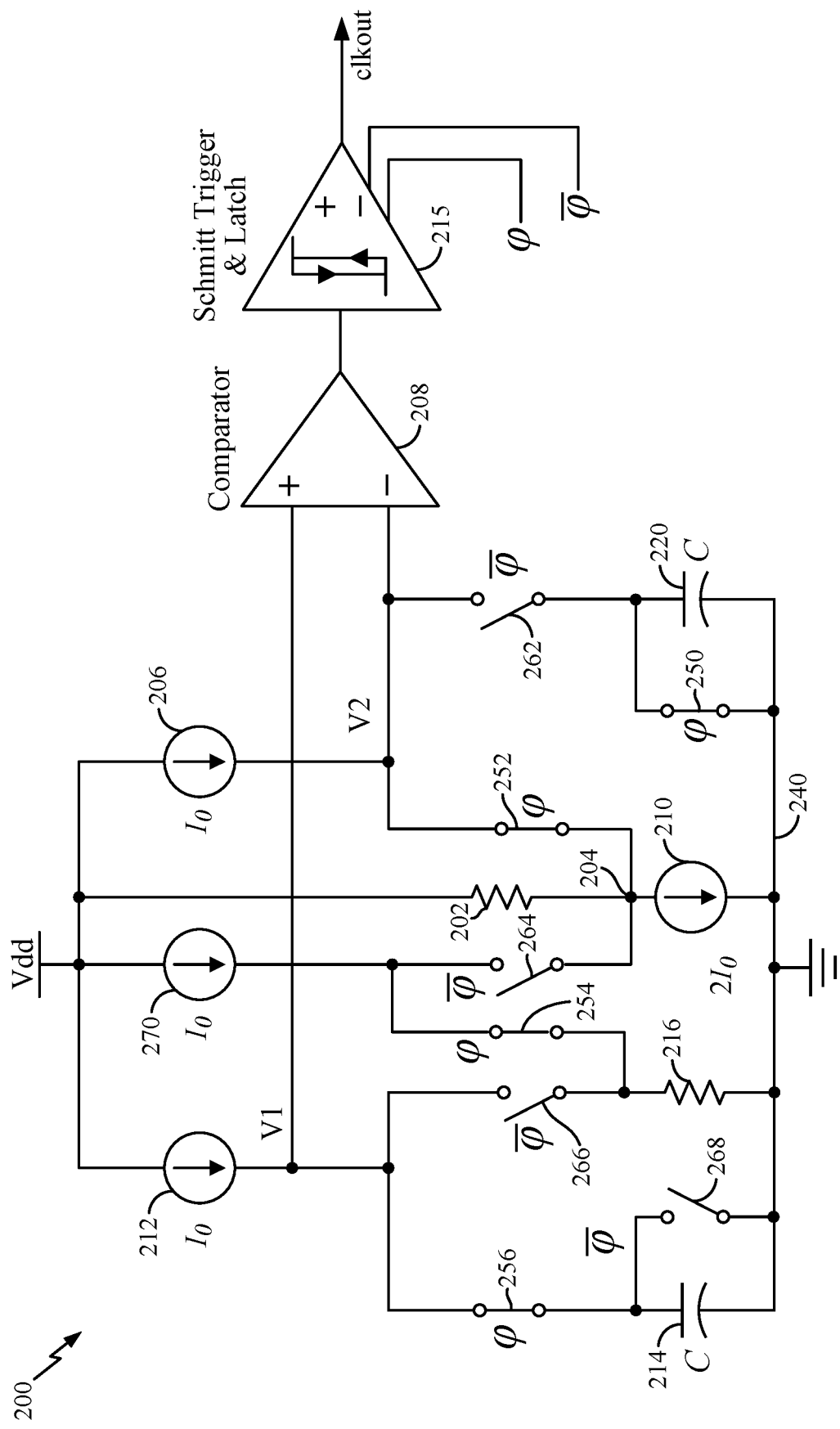
FIGS. 2A and 2B illustrate a circuit diagram of an oscillator during a first phase of operation and a second phase of operation, respectively, in accordance with certain aspects of the present disclosure.
Figure 2B:
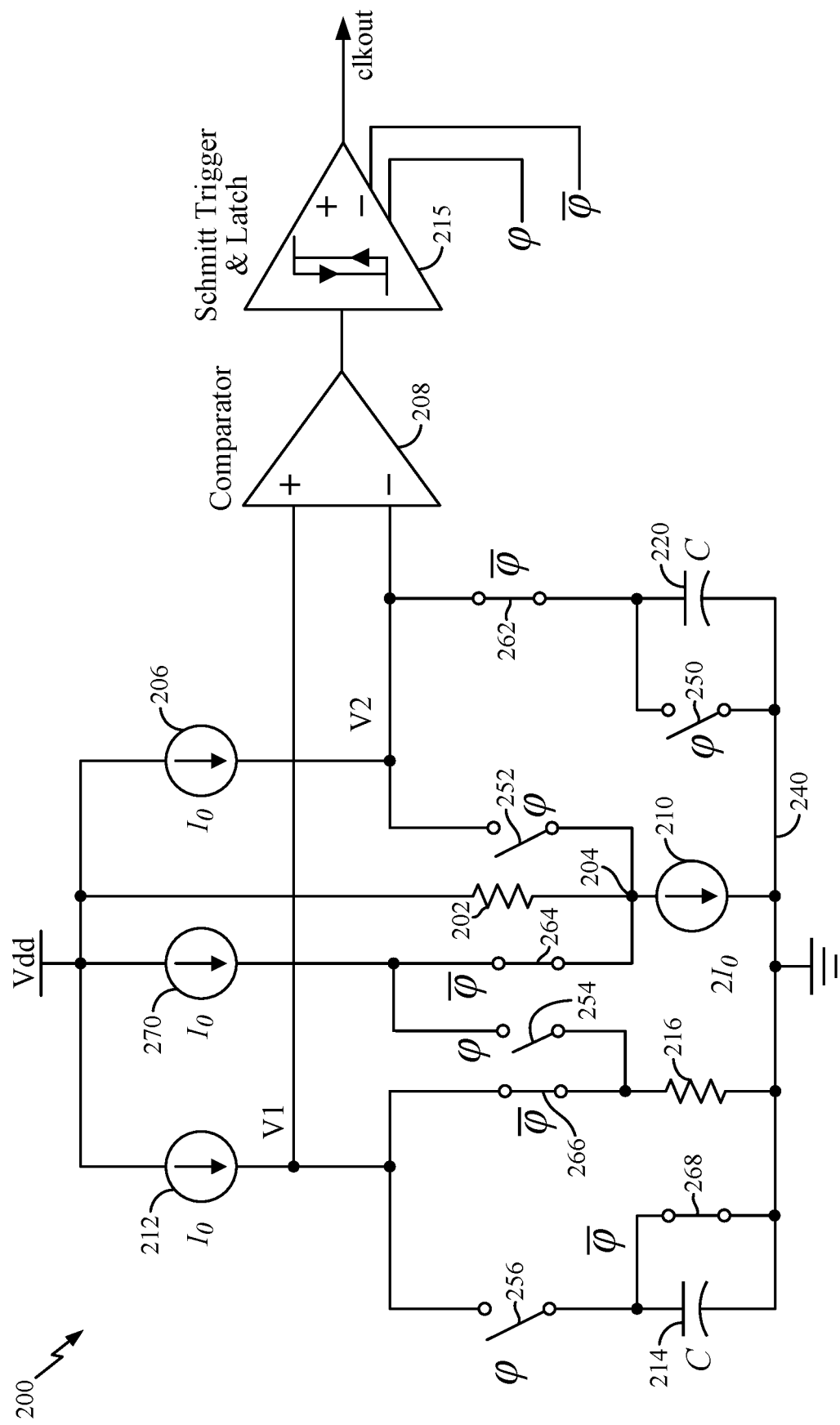
Figure 3:
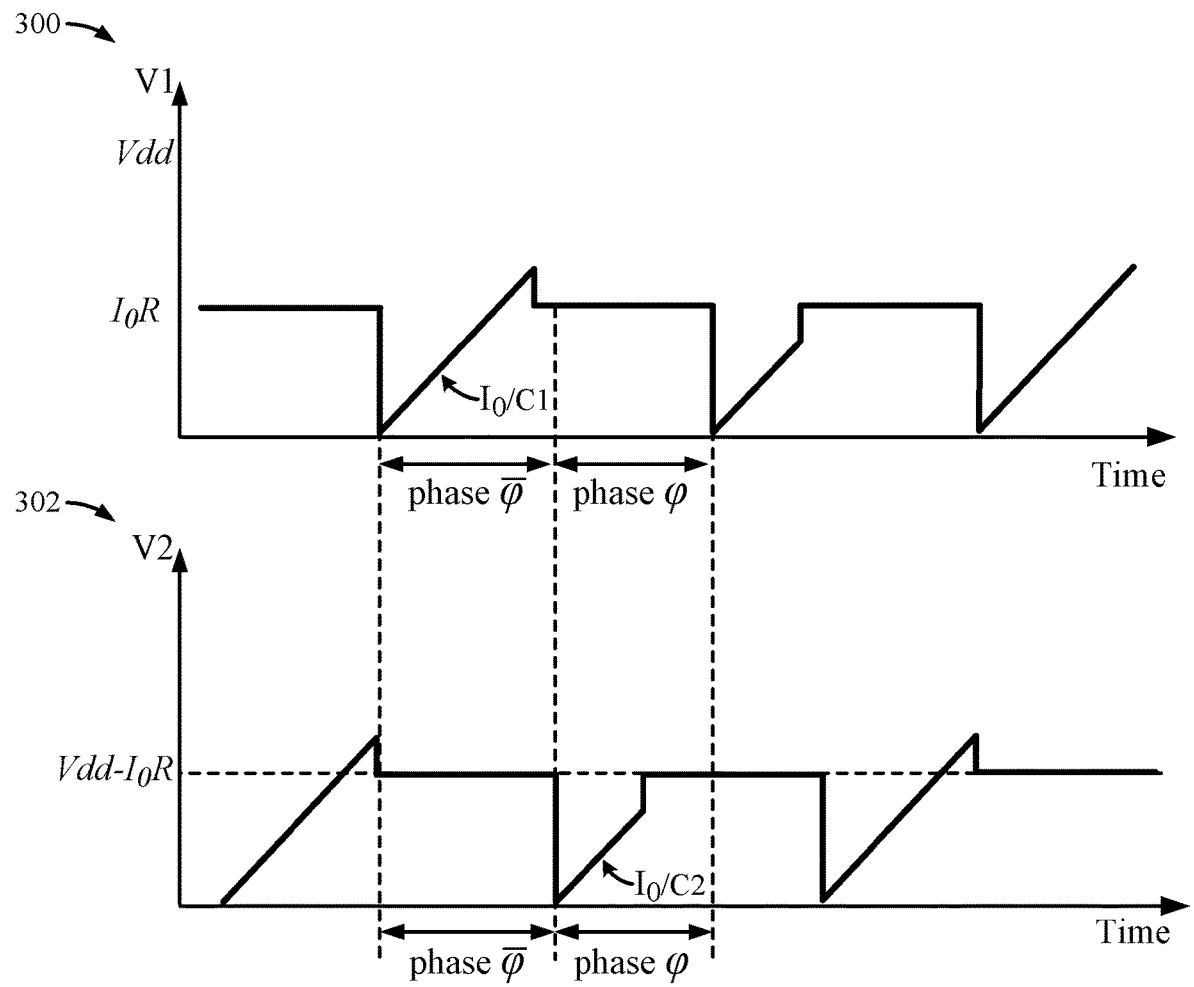
FIG. 3 illustrates graphs showing voltages of the oscillator of FIGS. 2A and 2B, in accordance with certain aspects of the present disclosure.

FIGS. 2A and 2B illustrate a circuit diagram of an oscillator 200 during a first phase φ of operation and a second phase φ of operation, respectively, in accordance with certain aspects of the present disclosure. FIG. 3 illustrates graphs 300, 302 showing voltages V1, V2, respectively, of the oscillator 200, in accordance with certain aspects of the present disclosure.

During the first phase φ, switches 250, 252, 254, 256 are closed, and switches 262, 264, 266, and 268 are open, as illustrated in FIG. 2A. During the first phase φ, current source 206 sources a current $I_0$ to node 204 via switch 252, and current source 210 sinks a current that is twice the current $I_0$ ($2I_0$) from the node 204. Therefore, a current flows from the voltage rail Vdd to the node 204, through resistive element 202, that is about equal to $I_0$. As a result, during the first phase φ, voltage V2 is generated at the negative terminal of comparator 208 and is represented by the following equation:

$$V2 = Vdd - (I_0 R1)$$

where R1 is the resistance of the resistive element 202, as shown in graph 302. In other words, the voltage V2 during the first phase φ is referenced to Vdd.

During the first phase φ, current source 212 sources a current $I_0$ to capacitive element 214 via the switch 256, gradually charging the capacitive element 214. Thus, voltage V1 at the positive input terminal of the comparator 208 (e.g., the voltage across the capacitive element 214) increases at a rate represented by the expression $I_0/C1$, where C1 is the capacitance of the capacitive element 214, as illustrated by graph 300.

The output of the comparator 208 may transition from logic low to logic high after the voltage V1 supersedes the voltage V2, ending the first phase φ and beginning the second phase $\bar{\varphi}$. The exact moment when the output of the comparator 208 transitions from logic low to logic high may be based on the offset voltage associated with the comparator 208. For example, as the offset voltage of the comparator 208 increases, the duration of the first phase φ increases.

After a delay associated with the comparator 208 and a Schmitt trigger and latch circuit 215, the second phase φ begins, during which the switches 262, 264, 266, and 266 are closed, and the switches 250, 252, 254, 256 are open. During the second phase $\bar{\varphi}$, the current source 212 sources a current $I_0$ to flow across the resistive element 216 via the switch 266, generating a voltage V1 at the positive input terminal of the comparator 208 to be equal to the product of $I_0$ and R2, where R2 is the resistance of the resistive element 216, as illustrated by graph 300. In other words, the voltage V1 during the second phase φ is referenced to the reference potential (e.g., electric ground), at the reference potential node 240.

During the second phase $\bar{\varphi}$, the current source 206 sources a current $I_0$ to the capacitive element 220 via the switch 262, charging the capacitive element 220. Thus, the voltage V2 at the negative input terminal of the comparator 208 (e.g., the voltage across the capacitive element 220) increases at a rate represented by the expression $I_0/C2$, where C2 is the capacitance of the capacitive element 220, as illustrated by graph 302. In certain aspects, the capacitance of the capacitive element 220 may be the same as the capacitance of the capacitive element 214 within a particular tolerance (e.g., 5%). As illustrated, the capacitive element 220 is discharged during the first phase φ by closing switch 250, and the capacitive element 214 is discharged during the second phase $\bar{\varphi}$ by closing switch 268.

The output of the comparator 208 may transition from logic high to logic low after the voltage V2 exceeds the voltage V1, ending the second phase $\bar{\varphi}$ and beginning the first phase φ. The exact moment when the output of the comparator 208 transitions from logic high to logic low may be based on the offset voltage associated with the comparator 208. For example, as the offset voltage of the comparator 208 increases, the duration of the second phase $\bar{\varphi}$ decreases. In other words, the offset associated with the comparator 208 has the opposite impact on the duration of the first phase φ as the second phase $\overline{\varphi}$. Therefore, the offset of the comparator 208 has little to no impact on the period (e.g., corresponding to the sum of the durations of the first phase $\varphi$ and the second phase $\overline{\varphi}$ of the oscillating signal (e.g., clkout) generated by the oscillator 200.

In certain aspects, the Schmitt trigger and latch circuit 215 may be coupled to the output of the comparator 208 for generating the signals for controlling the switches 256, 266, 268, 254, 264, 252, 250, 262. For example, the Schmitt trigger and latch circuit 215 may generate signals $\varphi$ for controlling the switches 256, 254, 252, 250, and signals $\overline{\varphi}$ (inverse of signals $\varphi$) for controlling the switches 268, 266, 264, 262. In certain aspects, a delay may be implemented between the falling edge of the signals $\varphi$ and the rising edge of the signals $\overline{\varphi}$, and vice versa, via the Schmitt trigger and latch circuit 215 to prevent any of the switches 256, 254, 252, 250 to be closed simultaneously with any of the switches 268, 266, 264, 262. The Schmitt trigger and latch circuit 215 may generate the oscillating signal (clkout) which may be used by the device 100 for time keeping.

In some cases, temperature variations may cause the resistance of the resistive elements 202, 216 to vary. However, the resistances of the resistive elements 202, 216 both increase or both decrease due to temperature variations. Moreover, the change in the resistances of the resistive elements 202, 216 has the opposite impact on the V2 voltage during the first phase $\varphi$ as it does on the voltage V1 during the second phase $\overline{\varphi}$ since the voltage V1 during the second phase $\varphi$ is referenced to the reference potential and the voltage V2 during the first phase $\overline{\varphi}$ is referenced to Vdd. In other words, if the resistances of the resistive elements 202, 216 increase (decrease), the voltage V2 during the first phase increases (decreases), and the voltage V1 during the second phase decreases (increases), increasing (decreasing) the duration of the first phase and decreasing (increasing) the duration of the second phase. As a result, the period of the oscillating signal (e.g., corresponding to the sum of the durations of the first phase $\varphi$ and the second phase $\overline{\varphi}$ remains unchanged due to temperature variations.

In certain aspects, a current source 270 may be implemented to keep the capacitance (e.g., parasitic capacitance) that may be in parallel with the resistive element 216 charged during the first phase $\varphi$. In this manner, the voltage V1 may be set to the product of $I_0$ and R2 (e.g., resistance of the resistive element 216) more quickly after the transition to the second phase $\overline{\varphi}$. Similarly, the current source 270 together with current source 210 allow for current $I_0$ to continue flowing across the resistive element 202 during the second phase $\overline{\varphi}$, allowing the voltage V2 to be set to Vdd−($I_0$R1) more quickly after the transition to the first phase $\varphi$. In certain aspects, the current sources 212, 270, 206, 210 may be bandgap current sources that source or sink constant current in response to temperature variations.

Figure 4:
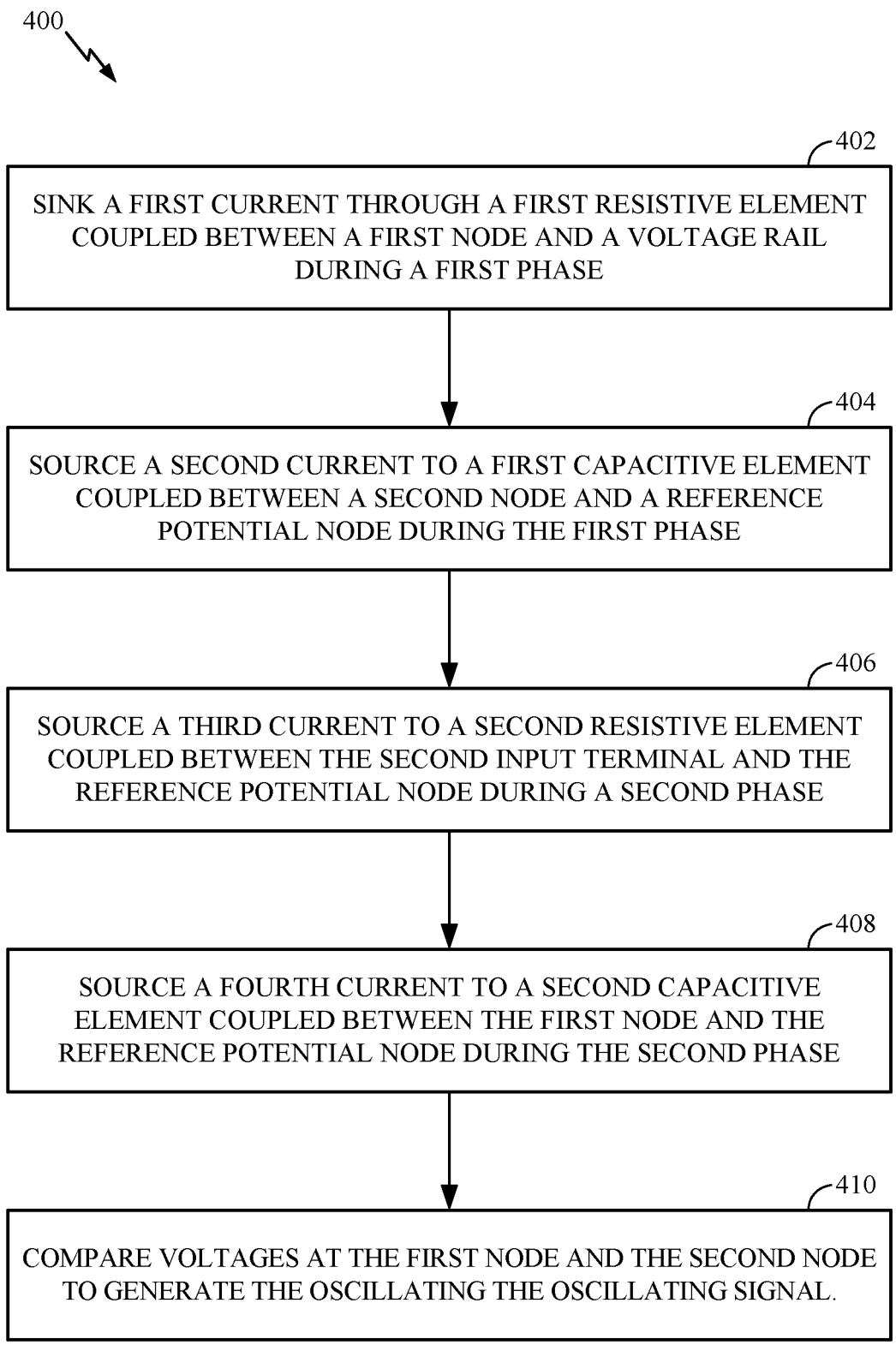
FIG. 4 is a flow diagram illustrating example operations for generating an oscillating signal, in accordance with certain aspects of the present disclosure.

FIG. 4 is a flow diagram illustrating example operations 400 for generating an oscillating signal, in accordance with certain aspects of the present disclosure. The operations 400 may be performed by an oscillator, such as the oscillator 200.

The operations 400 begin, at block 402, with the oscillator sinking (e.g., via the current sources 206, 210) a first current through a first resistive element (e.g., resistive element 202) coupled between a first node (e.g., the negative input terminal of comparator 208) and a voltage rail during a first phase (e.g., phase $\varphi$), and at block 404, sourcing (e.g., via current source 212) a second current to a first capacitive element (e.g., capacitive element 214) coupled between a second node (e.g., positive input terminal of the comparator 208) and a reference potential node (e.g., reference potential node 240) during the first phase.

At block 406, the oscillator sources (e.g., via current source 212) a third current to a second resistive element (e.g., resistive element 216) coupled between the second node and the reference potential node during a second phase (e.g., phase $\overline{\varphi}$), and at block 408, sources (e.g., via current source 206) a fourth current to a second capacitive element (e.g., capacitive element 220) coupled between the first node and the reference potential node during the second phase. At block 410, the oscillator compares (e.g., via the comparator 208) voltages at the first node and the second node to generate the oscillating signal.

In certain aspects, the operations 400 may also include the oscillator sourcing (e.g., via current source 270) a fifth current to the second resistive element during the first phase, and sinking (e.g., via the current source 210) a sixth current through the first resistive element during the second phase. The first current and the sixth current share the same path through the first resistive element, but may have different amperes in time. In certain aspects, the operations 400 may also include the oscillator discharging (e.g., by closing switch 266) the first capacitive element during the second phase, and discharging (e.g., by closing switch 250) the second capacitive element during the first phase.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

In certain aspects, means for sinking and means for sourcing may include a current source, such as the current sources 212, 270, 206, 210. In certain aspects, means for comparing may include a comparator, such as the comparator 208. In certain aspects, means for discharging may include a switch, such as the switches 250, 268.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with discrete hardware components designed to perform the functions described herein. The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An oscillator comprising:
a comparator;
a first current source coupled to a reference potential node;
a first resistive element coupled between the first current source and a voltage rail, a node between the first current source and the first resistive element being selectively coupled to a first input terminal of the comparator;
a second current source coupled between a second input terminal of the comparator and the voltage rail; and
a first capacitive element selectively coupled between the second input terminal of the comparator and the reference potential node.

2. The oscillator of claim 1, further comprising a third current source coupled between the voltage rail and the first input terminal of the comparator.

3. The oscillator of claim 2, further comprising:
a second capacitive element selectively coupled between the first input terminal of the comparator and the reference potential node; and
a second resistive element selectively coupled between the second input terminal of the comparator and the reference potential node.

4. The oscillator of claim 3, wherein a capacitance of the first capacitive element is the same as the capacitance of the second capacitive element.

5. The oscillator of claim 3, further comprising a first switch coupled in parallel with the second capacitive element.

6. The oscillator of claim 5, further comprising a second switch coupled in parallel with the first capacitive element.

7. The oscillator of claim 6, further comprising:
a third switch coupled between the first input terminal of the comparator and the second capacitive element;
a fourth switch coupled between the second input terminal of the comparator and the first capacitive element;
a fifth switch coupled between the first input terminal of the comparator and the node between the first resistive element and the first current source; and
a sixth switch coupled between the second input terminal of the comparator and the second resistive element.

8. The oscillator of claim 7, wherein:
the comparator is configured to generate a signal by comparing voltages at the first input terminal and the second input terminal;
the first switch, the fourth switch, and the fifth switch are configured to be controlled based on the signal; and
the second switch, the third switch, and the sixth switch are configured to be controlled based on an inverse of the signal.

9. The oscillator of claim 7, wherein:
the first switch, the fourth switch, and the fifth switch are configured to be closed during a first phase of the oscillator; and
the second switch, the third switch, and the sixth switch are configured to be closed during a second phase of the oscillator.

10. The oscillator of claim 3, further comprising a fourth current source selectively coupled between the voltage rail and the node between the first current source and the first resistive element.

11. The oscillator of claim 10, wherein the fourth current source is further selectively coupled between the voltage rail and the second resistive element.

12. The oscillator of claim 1, further comprising a switch coupled in parallel with the first capacitive element.

13. The oscillator of claim 1, wherein the first input terminal comprises a negative input terminal of the comparator and wherein the second input terminal comprises a positive input terminal of the comparator.

14. A method for generating an oscillating signal, comprising:
sinking a first current through a first resistive element coupled between a first node and a voltage rail during a first phase;
sourcing a second current to a first capacitive element coupled between a second node and a reference potential node during the first phase;
sourcing a third current to a second resistive element coupled between the second node and the reference potential node during a second phase;
sourcing a fourth current to a second capacitive element coupled between the first node and the reference potential node during the second phase; and
comparing voltages at the first node and the second node to generate the oscillating signal.

15. The method of claim 14, further comprising:
sourcing a fifth current to the second resistive element during the first phase; and
sinking a sixth current through the first resistive element during the second phase.

16. The method of claim 14, further comprising:
discharging the first capacitive element during the second phase; and
discharging the second capacitive element during the first phase.

17. The method of claim 14, wherein a capacitance of the first capacitive element is the same as the capacitance of the second capacitive element.

18. An apparatus for generating an oscillating signal, comprising:
means for sinking a first current through a first resistive element coupled between a first node and a voltage rail during a first phase;
means for sourcing a second current to a first capacitive element coupled between a second node and a reference potential node during the first phase;
means for sourcing a third current to a second resistive element coupled between the second node and the reference potential node during a second phase;
means for sourcing a fourth current to a second capacitive element coupled between the first node and the reference potential node during the second phase; and
means for comparing voltages at the first node and the second node to generate the oscillating signal.

19. The apparatus of claim 18, further comprising:
means for sourcing a fifth current to the second resistive element during the first phase; and
means for sinking a sixth current through the first resistive element during the second phase.

20. The apparatus of claim 18, further comprising:
means for discharging the first capacitive element during the second phase; and
means for discharging the second capacitive element during the first phase.

\* \* \* \* \*